United States Patent [19]
Hogan et al.

[11] Patent Number: 6,075,698
[45] Date of Patent: Jun. 13, 2000

[54] REMOVABLE FAN FOR RACK MOUNTED RECTIFIERS

[75] Inventors: Gerald Michael Hogan, Mesquite; Steven Jeffery Marzec; Lyle James Ratner, both of Dallas, all of Tex.

[73] Assignee: ADS, The Power Resource, Inc., Dallas, Tex.

[21] Appl. No.: 09/179,785

[22] Filed: Oct. 27, 1998

[51] Int. Cl.[7] ..................................................... H05K 7/20
[52] U.S. Cl. ........................ 361/695; 361/690; 361/694; 361/715; 361/716; 361/725; 361/726; 174/16.1; 165/80.3; 165/104.34; 165/185; 312/223.1; 312/223.2; 454/184
[58] Field of Search ..................................... 361/676–678, 361/690–695, 715, 716, 719–721; 174/16.1; 165/80.3, 104.34, 185; 454/184; 312/223.1, 223.2

[56] References Cited

U.S. PATENT DOCUMENTS

| | | | |
|---|---|---|---|
| 4,744,005 | 5/1988 | Neustadt | 361/695 |
| 5,562,410 | 10/1996 | Sachs et al. | 361/695 |
| 5,587,881 | 12/1996 | Wang | 361/695 |
| 5,721,670 | 2/1998 | Cochrane et al. | 361/695 |
| 5,725,622 | 3/1998 | Whitson et al. | 55/385.4 |
| 5,751,549 | 5/1998 | Eberhardt et al. | 361/687 |
| 5,862,037 | 1/1999 | Behl | 361/687 |
| 5,890,959 | 4/1999 | Pettit et al. | 454/184 |
| 5,927,386 | 7/1999 | Lin | 165/80.3 |
| 5,999,403 | 12/1999 | Neustadt | 361/695 |

*Primary Examiner*—Leo P. Picard
*Assistant Examiner*—Boris L. Chervinsky
*Attorney, Agent, or Firm*—Gregory M. Howison; Mark W. Handley

[57] ABSTRACT

A rack mounted rectifier has a cooling fan module which is removable and replaceable in the field for servicing the rectifier when a cooling fan failure occurs. The rack mounted rectifier module includes a rectifier unit, a housing, DC output contacts, AC input contacts, and a data signal connector. The cooling fan module has a mounting bracket, a cooling fan unit which is secured to the mounting bracket, and a cooling fan connector which is mounted to the mounted bracket and electrically connected to the cooling fan motor. The housing of the rectifier unit has a socket for receiving the cooling fan module and a mating cooling fan connector for engaging the cooling fan connector to electrically connect the cooling fan unit to electric power when the cooling fan module is fully inserted within the socket. The socket for receiving the cooling fan module is open on a side of the housing of an exterior portion of the rectifier module, and is located for removing the cooling fan module only after the housing which has been partially removed from within the rectifier cabinet. The socket is located in the housing such that the cooling fan module cannot be removed from the housing until the rectifier module is at least partially removed from the enclosed space, such that the DC output contacts and the AC input contacts of the rectifier module are disconnected from mating contacts of the rectifier cabinet.

20 Claims, 5 Drawing Sheets

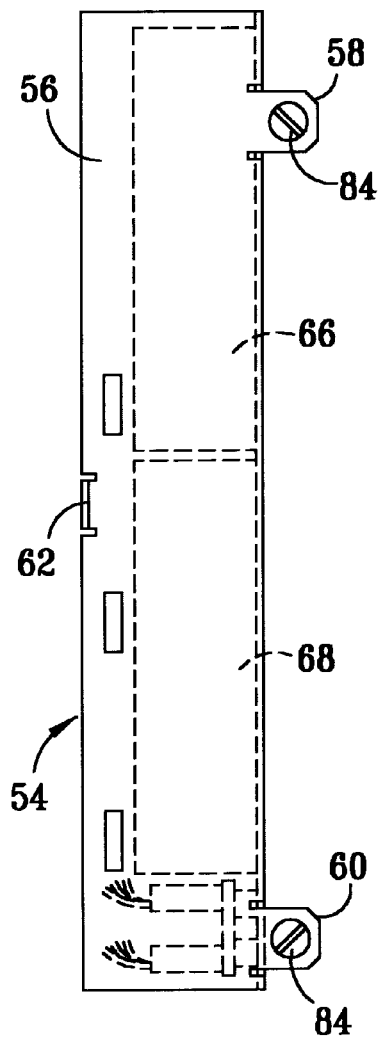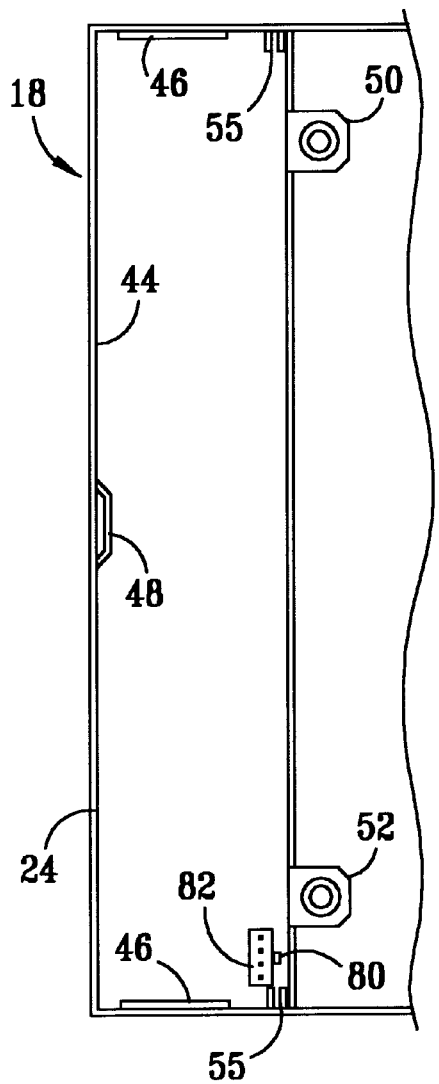

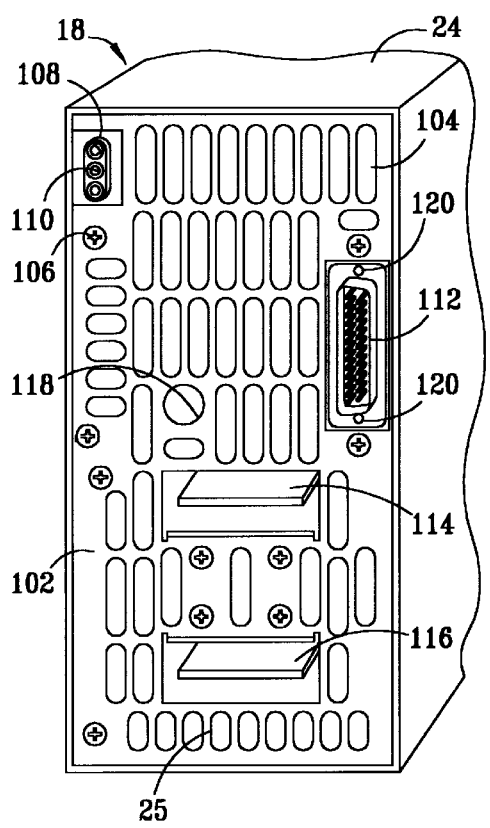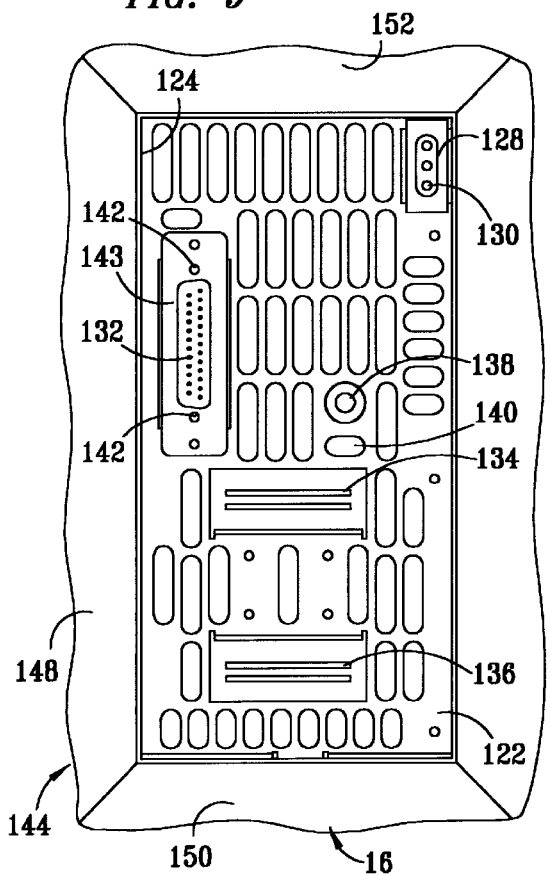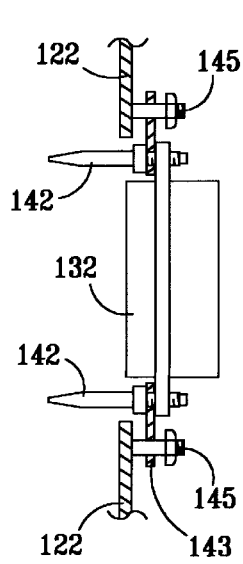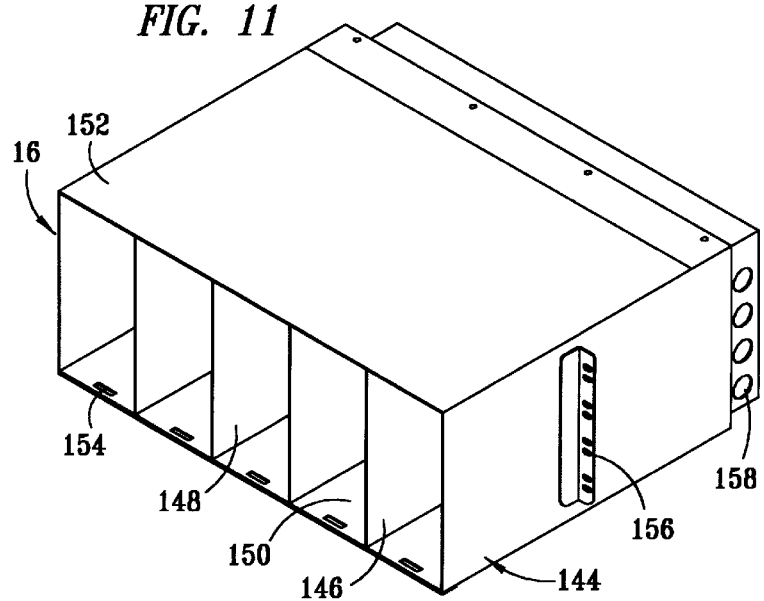

REMOVABLE FAN FOR RACK MOUNTED RECTIFIERS

CROSS REFERENCE TO RELATED APPLICATIONS

This application is related to co-pending U.S. patent application Ser. No. 09/179,784, entitled, "INTERCONNECTION SYSTEM FOR RACK MOUNTED RECTIFIERS" (Atty Dkt No. ADSI-24,418) filed of even date herewith.

TECHNICAL FIELD OF THE INVENTION

The present invention relates in general to rack mounted rectifiers, and in particular to a rack mounted rectifier having a removable fan module.

BACKGROUND OF THE INVENTION

Prior art rack mounted rectifiers have been provided for mounting in rectifier cabinets. Such rectifiers have an AC input and a DC output. Rectifier cabinets have found extensive use in the rapidly expanding telecommunications industry, providing power for telephone switch gear and the like. Rectifier cabinets have been provided of modular design, in which rectifier modules are removably mounted within the cabinets. The rectifier modules may be "hot swapped"; that is, a portion of the rectifiers may be removed from the rectifier cabinets without having to shut down the entire cabinet such that power may be maintained for the equipment being powered by the rectifier cabinet being serviced.

Each rectifier module is typically provided with a cooling fan unit, which includes a fan and a motor. The cooling fan unit is required to remove the heat generated by the individual rectifier units included within the rectifier modules. The main cause of failure of the rectifier modules is due to failure of the cooling fan motors. Replacement of fan motors of prior rectifier modules is not easily accomplished in the field; rather, the modules are removed and shipped to a repair facility where fan components are replaced. This requires that spare rectifier modules be available such that rectifier power centers which include a plurality of cabinets need not be taken off-line while failed rectifier modules are being sent to a remote shop for servicing and repair.

SUMMARY OF THE INVENTION

The present invention disclosed and claimed herein is directed toward a rack mounted rectifier for use in a rectifier cabinet. The rack mounted rectifier has a cooling fan module which is removable and replaceable in the field for servicing when a cooling fan failure occurs. The rack mounted rectifier module includes a rectifier unit, a housing, DC output contacts, AC input contacts, and a data signal connector. The cooling fan module has a mounting bracket, a cooling fan unit which is secured to the mounting bracket, and a cooling fan connector which is mounted to the mounted bracket and electrically connected to the cooling fan motor. The housing of the rectifier unit has a socket for receiving the cooling fan module and a mating cooling fan connector for engaging the cooling fan connector to electrically connect the cooling fan unit to electric power when the cooling fan module is fully inserted within the socket. The socket for receiving the cooling fan module is open on a side of the housing of an exterior portion of the rectifier module, and is located for removing the cooling fan module only after the housing which has been partially removed from within the rectifier cabinet.

In another aspect of the present of the present invention, the cooling fan module fits flush with the side of the housing which is an exterior portion of the rectifier module, when the cooling fan module is fully engaged with the housing.

In another aspect of the present invention, the socket is located in the housing such that the cooling fan module cannot be removed from the housing until the rectifier module is at least partially removed from the enclosed space, such that the DC output contacts and the AC input contacts of the rectifier module are disconnected from mating contacts of the rectifier cabinets.

In another aspect of the present invention, the rectifier module has a power circuit connected between the AC input contacts such that the AC input contacts are disengaged from electrically connecting the rectifier unit to AC power when the cooling fan connector is not electrically engaged to the mating cooling fan connector of the rectifier unit.

In another aspect of the present invention, a guide pin member is mounted to one of the cooling fan module and the housing of the rectifier unit for engaging within a guide member hole mounted to the other of the cooling fan and the housing when the module is engaged within the socket of the housing, for aligning the cooling fan connector and the mating cooling fan connector for automatically engaging when the cooling fan unit is inserted into the socket of the housing.

BRIEF DESCRIPTION OF THE DRAWINGS

For a more complete understanding of the present invention and the advantages thereof, reference is now made to the following description taken in conjunction with the accompanying Drawings in which:

FIG. 6 illustrates a right side elevational view of the fan module;

FIG. 7 illustrates a partial, side elevational view of the housing of the rectifier module;

FIG. 8 illustrates a partial, perspective view of the rearward end of the rectifier module;

FIG. 9 illustrates a frontal perspective view of a mating plate of one of the rectifier panels;

FIG. 10 illustrates partial, side elevational view depicting the mounting of the data signal connector to the rectifier cabinet;

FIG. 11 illustrates a perspective view of a panel housing of one of the rectifier panels.

DETAILED DESCRIPTION OF THE INVENTION

Figure 1:
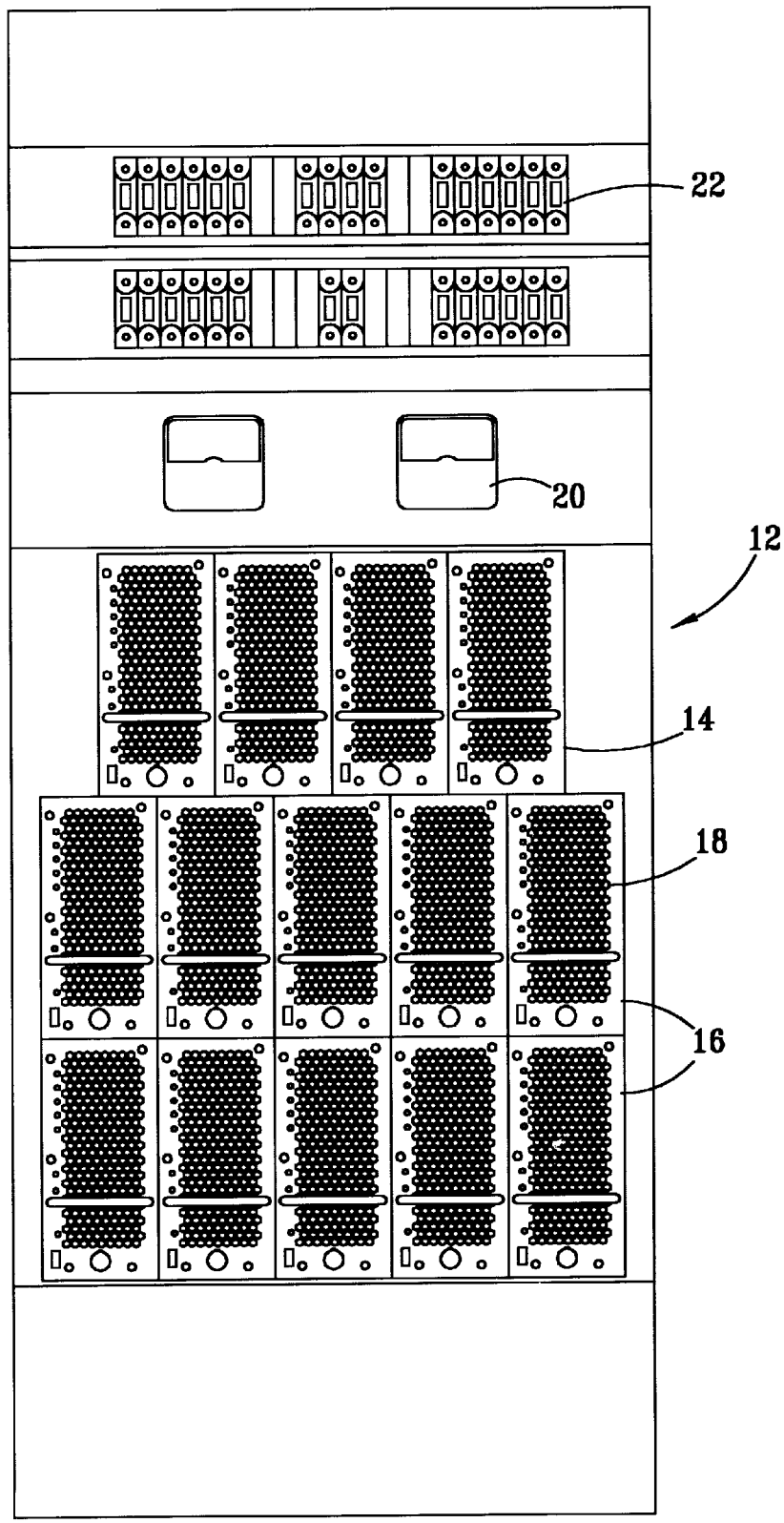
FIG. 1 illustrates a front, elevational view of a rectifier cabinet made according to the present invention.

Referring now to FIG. 1, there is illustrated a front, elevational view of a rectifier cabinet 12. The rectifier cabinet 12 includes a plurality of rectifier panels 14 and rectifier panels 16, within which rectifier modules 18 are mounted. Preferably, each of the rectifier panels 14 will receive four of the rectifier modules 18, and each of the rectifier panels 16 will receive five of the rectifier modules 18. Cabinet gauges 20 are provided for monitoring the voltage and the current output of the rectifier cabinet 12. A plurality of power circuit breakers 22 are provided at the top of the rectifier cabinet 12.

Figure 2:
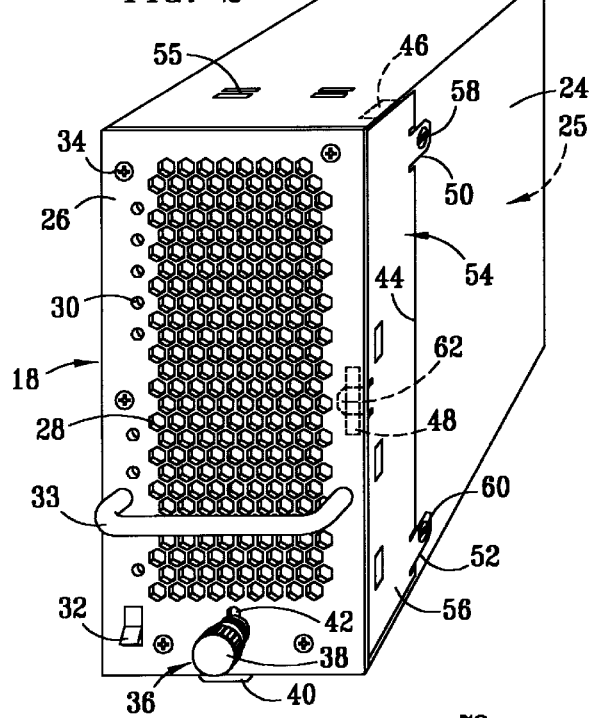
FIG. 2 illustrates a frontal, perspective view of one of the rectifier modules.

Referring now to FIG. 2, there is illustrated a frontal, perspective view of one of the rectifier modules 18. The rectifier module 18 includes a housing 24, which engages a rectifier unit 25. The housing 24 has a front plate 26 which is preferably perforated by a plurality of honeycomb-shaped perforations 28 that provide air flow ports for cooling the interior of the module 18. A plurality of LEDs 30 are disposed on the left side of the front plate 26 of the rectifier module 18 and provide output signal indicators. A main power switch 32 is disposed on the lower left of the front plate 26. A handle 33 is provided by a round rod which is u-shaped and mounted to extend forward of the front plate 26 of the module 18. A latch 36 includes a knob 38 and a latch plate 40, which provides a latch member. The knob 38 is fastened to the latch plate 40 by a threaded bolt which slides within the vertical slot 42. The knob 38 is rotated clockwise to grip the front plate 26 between the latch plate 40 and the knob 38. The knob 38 is rotated counterclockwise such that the knob 38 and latch plate 40 will slide within the vertical slot 42 of the front plate 26. The knob 38 and the latch plate 40 may be pulled upwards until the bottom of the latch plate 40 is flush with the bottom of the front plate 26 and the bottom of the housing 24, which is herein defined as the unlatched position for the latch 36.

The housing 24 of the rectifier module 18 has an opening 44. Two notches 46 (one shown) are provided at the top and bottom, respectively, of the opening 44. A strap 48 is defined by recesses formed into the side surface of the module 18, rearward of the front plate 26 of the housing 24. Notches 50 and 52 are defined on the rearward side of the opening 44 by the recesses formed into the side surface of the module 18. The opening 44 is sized for receiving a removable fan module 54. The fan module 54 is removably mounted to the rectifier module 18 such that a failed fan module 54 may be replaced without requiring replacement of the entire rectifier module 18. Four pairs of indentations 55 (two shown) into the top and bottom provide guides for receiving a portion of the fan module 54.

Figure 3:
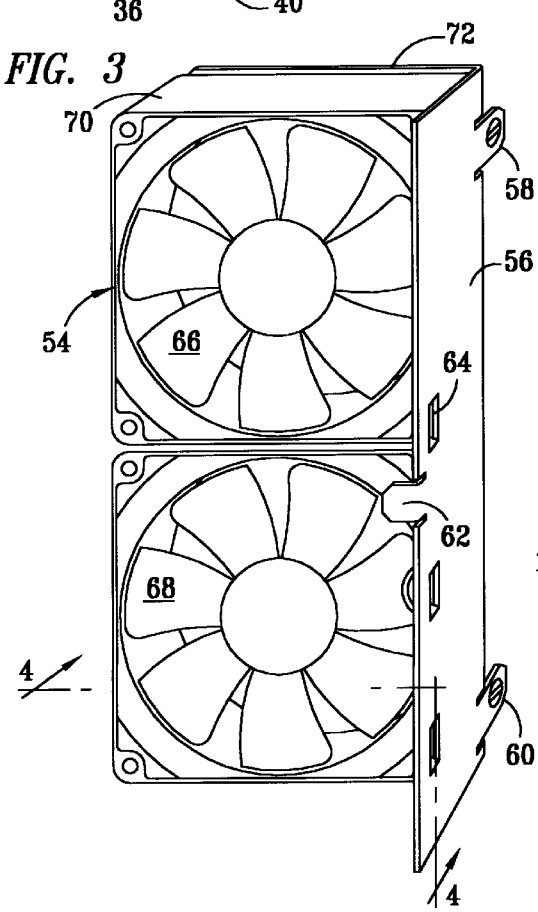
FIG. 3 illustrates a frontal perspective view of the fan module.

Referring now to FIG. 3, there is illustrated a frontal elevation view of the fan module 54. The fan module 54 includes a side plate 56, which is received between the pairs of indentations 55 to align the fan modules 54 during insertion into the socket 44. The side plate 56 includes tab 58, tab 60 and tab 62. The fan module 54 includes the holes 64 which are formed into the side plate 56. Two fan units 66 and 68 are mounted to the fan module 54, each including fan blades and an electric fan motor. A sidewall 70 extends around three sides of the fans 66 and 68. A back plate 72 is provided with two holes which are preferably sized full bore with respect to the fans 66 and 68.

Figure 4:
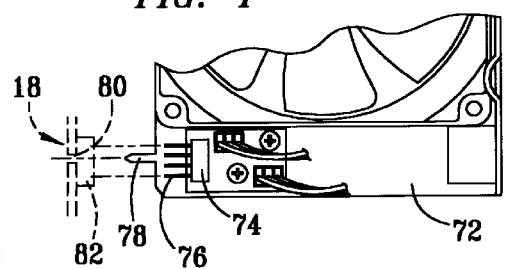
FIG. 4 illustrates a partial cut-away view of the fan module, showing the lower portion of the back plate.

Referring now to FIG. 4, there is illustrated a partial cut-away view of the fan module 54, showing the lower portion of the back plate 72 in more detail. The back plate 72 has an electrical connector 74 mounted thereto. The connector 74 has power contacts 76. A guide pin 78 is integrally formed as a singular member with the back plate 72, and for mating with a guide hole 80 mounted to the housing 24 of the rectifier module 18. An electrical connector 82 is also mounted within the housing 24 of the rectifier module 18, and has contacts for engaging the contacts 76 of the connector 74 to electrically connect the fan module 54 to the rectifier module 18.

Figure 5:
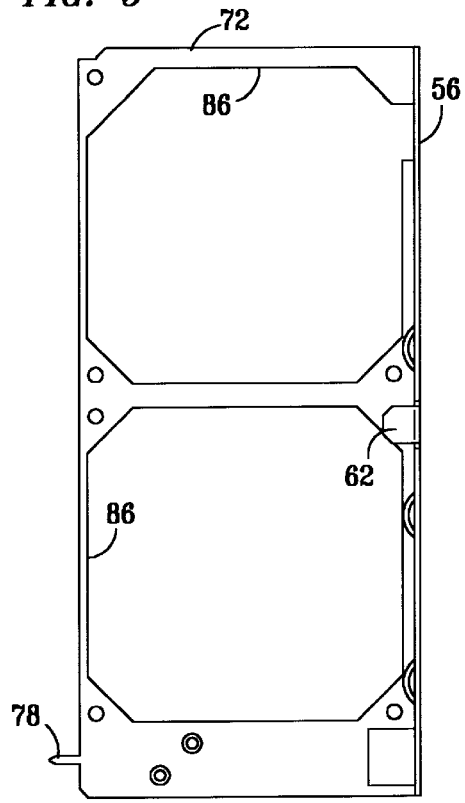
FIG. 5 illustrates a frontal elevation view of a back plate and a side plate of the mounting bracket for the fan module.

Referring now to FIG. 5, there is illustrated a frontal elevation view of a back plate 72 and a side plate 56. The guide pin 78 is shown as extending from the side of the back plate 78, being formed from an edge of the back plate 72. Preferably, the guide pin 78 and the back plate 72 are machined from a single, flat sheet of aluminum. Two apertures 86 are cut into the back plate 72 for aligning and registering with the fans 66 and 68 (shown in FIG. 3).

Referring now to FIG. 6, there is illustrated a side elevational view of the fan module 54. The tabs 58 and 60 are shown having two captured screws 84. The tab 64 is bent over a right angle for engaging within the strap 48 of the front plate 26 (shown in FIG. 2). The tabs 58 and 60 will fit within the notches 50 and 52 formed into the housing 24, with the outward sides of the tabs 58, 60 and the face plate 56 fitting flush with the side of housing 24.

Referring now to FIG. 7, there is illustrated a partial side elevational view of the housing 24 of the rectifier module 18. The notches 46 are depicted on the top and bottom of the opening 44. The opening 44 provides a socket for receiving the fan module 54. The strap 48 is shown for receiving the tab 62 of the fan module 54. Also depicted is the connector 82 having the guide hole 80 for receiving the guide pin 78 of the back plate 72, which provides a mounting bracket of the fan module 54. The protuberances provided by the indents 55 provide pairs of guide tabs for receiving the edges of the top and bottom of the back plate 72, for aligning the connector 74 and the guide pin 78 for being received in respective ones of the connector 82 and the guide hole 80.

Referring now to FIG. 8, there is illustrated a partial perspective view of the rearward end of the rectifier module 18. The rectifier module 18 includes a back plate 102 having a plurality of vent holes 104 formed therethrough. Mounting screws 106 are provided for mounting the back plate 102 to the housing 24. An input power connector 108, having AC contacts 110, is mounted to the rectifier module 18 for connecting AC power to the rectifier module 18. A data signal connector 112 and output power DC contacts 114 and 116 are also mounted to the rectifier module 18. The data signal connector 112 is preferably an RS 232 connector. The output power DC contacts 114 and 116 are preferably provided by standard spade-type contacts for mating with clip-type contacts which are mounted to bus bars. A module guide member hole 118 is formed into the back plate 102. Data signal connector guide pin sockets 120 are formed on each end of the data signal connector 112. Preferably, the input power connector 108, the signal connector 112 and the output power DC contacts 114 and 116 are rigidly mounted to the back plate 102 and the housing 24 of the rectifier module 18, such that they will not move for registering with mating connectors of one of the rectifier panels 16 and 18.

Referring now to FIG. 9, there is illustrated a partial perspective view of a mating plate 122 of one of the rectifier panels 16. The mating plate 122 is provided for mating with components of the back plate 102 of the rectifier module 18. The mating plate 122 includes a plurality of vents holes 124. A power connector 128 is mounted to the mating plate 122 and has a plurality of AC contacts 130 for mating with the AC contacts 110 of the input power connector 108 of the rectifier module 18. A data signal connector 132 is mounted to the mating plate 122 for mating with the signal connector 112. A plurality of power DC contacts 134 and 136 are preferably provided by clip-type contacts which will engage the output power DC contacts 114 and 116 of the module 18. A guide member 138 extends in a horizontal direction from the mating plate 122 for engaging within the module guide member hole 118. The guide member 138 is provided by a tempered guide pin. An alternate guide member mounting hole 140 is provided such that the guide member 138 may be mounted therein when the mating plate 122 is connected by power contacts 134 and 136 to a bus of a different output voltage than that which the mating plate 122, as shown, is configured for mating with. The data signal connector 132 has two spaced apart guide pins 142 located on opposite sides of the data signal connector 132. The connector guide pins 142 are tapered guide pins which extend horizontally from the data signal connector 132 for mating with the guide pin sockets 120 of the data signal connector 112 of the rectifier module 18.

The gatherability of the mating components extending from the back plate 102 of the rectifier module 12 and the mating plate 122 of the rectifier panel 16 is provided such that a slight misalignment will not interfere with respective ones of the connectors and contacts lining up during installation. The sidewalls of the housing 24 align the guide member 138 of the mating plate 122 for fitting within the guide member hole 118 of the module 18 to provide a gross alignment for aligning the DC spade contacts 114 and 116 with the DC clip contacts 134 and 136. A fine alignment for aligning the data signal connector 112 with the data signal connector 132 is provided by the connector guide pins 142 fitting within the signal connector guide pin sockets 120. The data signal connector 132 is mounted to the mating plate 122 such that it is movable to float slightly to align with the data signal connector 112 of the module 18 according to registration of the connector guide pins 142 within the signal connector guide pin holes 120. The guide pins 142 mount the data signal connector 132 to a plate 143, which connects to the mounting plate 122 such that the plate 143 is movable over a limited range of motion relative to the mounting plate 122. The power connector 128 is moveable for a limited range of motion for aligning the AC contacts 130 with the AC contacts 110 of the input power connector 108 for supplying AC power to the rectifier module 18.

Referring now to FIG. 10, there is illustrated a partial, sectional side elevational view of the plate 122 of the rectifier panel 144, which depicts the mounting of the data signal connector 132 thereto. The guide pins 142 are rigidly mounted to the connector 132. The connector 132 is rigidly mounted to a plate 143. The plate 143 is mounted to the mating plate 122 of the panel housing 144 by fasteners 145. The fasteners 154 allow the mounting plate 143 to move relative to the mating plate 122 such that there is a slight amount of movement to allow play for the data signal connector 132 to mate with the data signal connector 112 of the rectifier module 18. The fasteners 125 may slip relative to the mating plate 122 in the mounting plate 143 for a limited distance.

Referring now to FIG. 11, there is illustrated a perspective view of a panel housing 144 of one of the rectifier panels 16. The panel housing 144 includes five partially enclosed spaces which define five rectifier module bays 146 for receiving respective ones of the rectifier modules 18. The forward ends of the bays 146 are open. The rectifier module bays 146 are separated by partition plates 148 which mounted directly between a bottom plate 150 and a top plate 152 of the panel housing 144. Preferably the partition plates 148 are provided by singular sheets of metal. Each of the rectifier bays 146 includes a latch slot 154 which extends through the bottom plate 150 for receiving a latch plate 40 (shown in FIG. 2). The forward end of the bottom plate 150 is folded-over, such that it has a double-walled thickness at the latch slot 154. The bottom of the latch plate 40 (shown in FIG. 2) will fit flush with the lower-most side of the bottom plate 150 to latch one of the modules 18 (shown in FIG. 1) into a respective one to the rectifier module bays 146. The housing 24 will fit within one of the rectifier module bays 146 with a slight clearance. Each of the rectifier modules bays 146 has one of the mating plates 122 disposed for matingly engaging with a back plate 102 of one of the rectifier modules 18. The panel housing 144 further includes a mounting bracket 156 for mounting the panel housing 144 within the rectifier cabinet 12. A plurality of cable ports are provided through a rearward flange of the panel housing 144.

Figure 12:
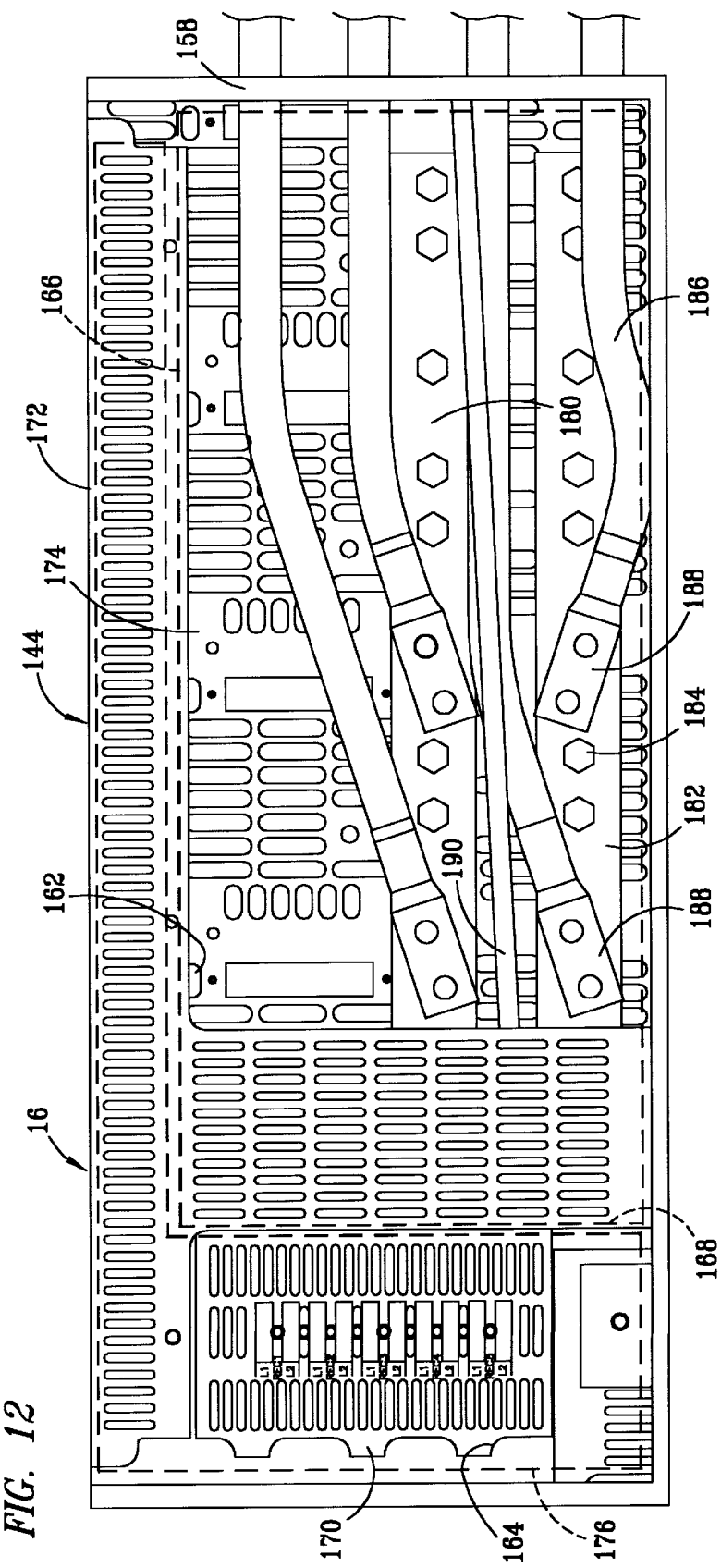
FIG. 12 illustrates a rear elevation view of the panel housing of the one of the rectifier panels.

Referring now to FIG. 12, there is illustrated a rear elevation view of the panel housing 144 of the one of the rectifier panels 16. The panel housing 144 includes an open, low voltage, rectified output compartment 162 and an enclosed AC power compartment 164. A barrier 166 and a barrier 168 extend on the sides of the low voltage compartment 162. A cover plate 170 is provided to cover the AC power compartment 164. The cover plate 170 fits flush with a back plate 172 of the panel housing 144. A mounting plate 174, which defines each of the mating plates 122 (shown in FIG. 9), extends beneath the AC power compartment 164. An AC vertical mounting plate 176 extends parallel to the mounting plate 174, and spaced apart therefrom such that bus bars 180 and 182 may be accessed with sufficient clearance for mounting the clip type DC contacts 134 and 136 thereto (shown in FIG. 9). A plurality of cables pass through the ports 158 and mount to intermediate portions of the buses 180 and 182 by being bolted thereto. The cables have connectors 188 for fastening the cables 186 to the respective one of the buses 180 and 182 with bolts.

A partition 190 extends between the buses 180 and 182 at an angle to the horizontal. The partition extends outward for several inches, such that a screw driver or other tool being used to connect components to the buses 180 and 182, and various other components of the panel 16, cannot bridge across and short the two buses 180 and 182. The partition 190 is canted to extend at an angle to the horizontal such that there will be clearance for passing cabling connectors 188 through the each of ports 158, and to allow the cabling connectors 188 to be connected to the upper bus 180, adjacent to the ports 158. The cabling connectors 188 require sufficient clearance for passing through the ports 158 on the bottom of the partition 190, and also require sufficient clearance for being secured above the partition to the bus 180. It should be noted that mounting the connectors 188 to intermediate positions of respective ones of the buses 180 and 182 provides that bus bars of a smaller size current capacity rating than that required for carrying the full current load of the panel 16 may be used, since the current flows to the center and not to one side of the bus bars 180 and 182. Thus, bus bars of a lower rated capacity and smaller physical size may be utilized to provide units which are of compact size.

In operation, one of the modules 18 may be removed from the cabinet 12 when a failure occurs. The switch 32 on the face plate is turned off. The latch knob 38 is rotated counterclockwise to release the knob 38 and the latch plate 40 from gripping the front plate 26 of the housing 24 therebetween. The latch plate 40 and the knob 38 are moved upwards such that the latch plate 40 will be cleared from the slot 154 and the module 18 may then be slid out of the forward end of one of the rectifier module bays 146 of one of the panel housings 144. If only the fan module 18 is to be replaced, the module 18 need only be moved forward a few inches until the tabs 58 and 60 clear the partition plates 148, such that the fasteners 84 may be released from engaging the housing 24 of the rectifier 18. The handle 33 may be gripped to pull the module 18 out of the forward end of one of the rectifier module bays 146. Moving the module 18 a few inches forward within the rectifier module bay 146 will electrically disconnect the module 18 from the panel housing 144, removing the connector 108 from the connector 128, removing the signal connector 112 from the signal connector 132, and removing the power output contacts 114 and 116 from respective ones of the contacts 134 and 136, which are connected to respective ones of the buses 184 and 186. Power will then be removed from the selected module 18.

If failure of the rectifier module 18 is due to a failure of the fan module 54, the fan module 54 may be replaced while the rectifier module 18 is only partially removed from the cabinet 12. The captive screws 84 are first released from securing the tabs 58 and 60 to the housing 24, then the fan module 54 may be slid out of the side of the housing 24 and removed form the rectifier module 18. Removal of the fan module from the rectifier module 18 disconnects the connector 74 from the connector 82, removing power from the fan and preferably electrically disabling the rectifier module 24 so that it cannot be inserted into the panel housing 144 and be powered up without the fan module 54 being installed. A new module 54 is installed in to the blind hole 44 of the housing 24 of the rectifier module 18. The fan module 54 is pushed inward with the upward and lower edges of the back plate 72 fitting between the four pairs of protuberances provided by the indentations 55, until the guide pin 78 mates with a guide pin hole 82 of the rectifier module 18. Then, the connector contacts 76 of the connector 74 are aligned for engaging with the contacts of the connector 82. The connector 74 of the module 54 is mated with the connector 82 of the rectifier module 18. The captive screws are then fastened to the housing 24. The rectifier module 18 is not enabled and cannot be inserted into one of the bays 146 of the panel housing 144 until the fan module 54 is fully inserted into the opening 44 of the housing 24. The captive screws 184 need to be fully engaged into the housing 144 with the rectifier module 18 such that they will clear the partition plates 148 and the rectifier module 18 may fit within one of the rectifier module bays 146.

During insertion of the rectifier module 18 into the rectifier module bay 146, the sidewalls of the housing 24 fit closely to respective ones of the partition plates 148, the top plate 152 and the bottom plate 150 of the panel 144, such that the guide pin member 148 fits within guide pin member hole 118. The contacts 114 and 116 will then engage within the clip contacts 134 and 136 to provide further alignment, such that the guide pins 142 of the connector 132 register with and fit within the guide pin holes 120 of the connector 112. The connector 132 will have a limited amount of play for aligning with the signal connector 112 which is rigidly secured to the back plate 102 of the rectifier module 18. Then, the AC power connector 128 will have a limited amount of movement for aligning with the connector 108 of the module 18 to connect power to the module 18 after the signal connector 112 is connected to the signal connector 132, and the output contacts 114 and 116 are connected to the contacts 134 and 136 of the panel housing 134. These connections will automatically align such that the connectors 108 and 112, and the contacts 114 and 116, will automatically register and mate with respective ones of the connectors 128, 132 and the output contacts 134 and 136. The contacts of the module 18 are self aligning with the components of the panel housing 144 of the rectifier module bay 146. The components mounted to the back plate 102 are then matingly engaged with the components mounted to the back plate 122, such that the rectifier module 18 may be operated. The switch 32 on the face plate of the module 18 then is turned back on.

The disclosed embodiment provides several advantages over prior art rectifier cabinets. Rectifier modules are provided which are self aligning such that they will blind mate with the rectifier panels during installation into the rectifier cabinets. The sidewalls of the housing of the rectifier modules are sized such that they are close fitting with the walls of the bays of the rectifier panels to algin a guide pin member for insertion into a guide pin member hole. This aligns the DC input and output contacts, which aligns the AC input and output contacts, and the data signal connector guide pins for insertion into guide pin sockets which aligns the data signal connectors. A flush type latch is provided which does not occupy excess space, such that a higher value of rectified output wattage per unit space is obtained to provide compactness. Rectifier modules are provided with replaceable fan units. The replaceable fan units are mounted to fan module which may be removed after the rectifier modules are moved but a few inches outward from their positions within the cabinets. Moving the rectifier modules outward a few inches to allow removal of the fan modules from the rectifier panels serves to disconnect power from the rectifier modules prior to access for removal of the fan modules such that the rectifier modules cannot be powered up and subsequently overheated. Removal of the fan moduled from the rectifier modules disables the rectifiers modules from being powered up. The rectifier modules may be hot swapped and the fans replaced while the remainder of the rectifier modules remain in operation to provide rectified power output from the power rectifier cabinet.

Although the preferred embodiment has been described in detail, it should be understood that various changes, substitutions and alterations can be made therein without departing from the spirit and scope of the invention as defined by the appended claims.

What is claimed is:

1. A rack mounted rectifier module for use in a rectifier cabinet having AC input and DC output, comprising:

a rectifier unit having DC output contacts, AC input contacts, data signal contacts, and a housing for mounting in said rectifier cabinet, with said DC output contacts, said AC input contacts and said data signal contacts electrically connected to said rectifier cabinet;

a cooling fan module having a mounting bracket, a cooling fan unit secured to said mounting bracket and a cooling fan power connector mounted to said cooling fan module and, electrically connected to said cooling fan unit for electrically connecting said cooling fan unit to said rectifier module;

said housing having a socket for receiving said cooling fan module, and a mating cooling fan power connector for engaging said cooling fan power connector to electrically connect said cooling fan unit to electric power when said cooling fan module is inserted within said socket; and wherein said socket for receiving said cooling fan module is open on a side of said housing which is exterior of said rectifier module, and located for removing and receiving said cooling fan module after said housing has been at least partially removed from within the rectifier cabinet.

2. The rack mounted rectifier module of claim 1, wherein said cooling fan module fits flush with said side of said housing which is exterior of said rectifier module, when said cooling fan module is fully engaged with said housing.

3. The rack mounted rectifier of claim 1, wherein said socket is disposed in said housing such that said cooling fan module cannot be removed from said housing of said rectifier module until said rectifier module is at least partially removed from said rectifier cabinet, such that said DC output contacts and AC input contacts of said rectifier module are disconnected from mating contacts of the rectifier cabinet.

4. The rack mounted rectifier module of claim 1, further comprising a rectifier module power circuit connected between said AC input contacts and said rectifier unit, and electrically connected to said mating cooling fan connector, such that at least one of said AC input contacts are disengaged from electrically connecting to said rectifier unit when said cooling fan connector and said mating cooling fan connector are not electrically engaged.

5. The rack mounted rectifier module of claim 1, further comprising a guide pin mounted to one of said cooling fan module and said housing for engaging within a guide hole mounted to the other of said cooling fan module and said housing when said cooling fan module is engaged within said socket of said housing, and aligning one of said cooling fan connector and said mating cooling fan connector for engaging the other of said cooling fan connector and said mating cooling fan connector.

6. The rack mounted rectifier module of claim 1, further comprising:
   mounting tabs extending from said mounting bracket of said cooling fan module for engaging within openings in said housing to secure said cooling fan module within said rectifier module; and
   captive fasteners mounted to at least part of said mounting tabs for fastening said cooling fan module within said socket of housing of said rectifier module.

7. The rack mounted rectifier module of claim 1, further comprising:
   a rectifier module power circuit connected between said AC input contacts and said rectifier unit, and electrically connected to said mating cooling fan connector, such that at least one of said AC input contacts are disengaged from electrically connecting to said rectifier unit when said cooling fan connector and said mating cooling fan connector are not electrically engaged; and
   a guide pin mounted to said cooling fan module for engaging within a guide hole of said housing when said cooling fan module is engaged within said socket of said housing, and aligning said cooling fan connector for engaging said mating cooling fan connector.

8. The rack mounted rectifier module of claim 1, further comprising
   said cooling fan module fitting flush with said side of said housing which is exterior of said rectifier module, when said cooling fan module is fully engaged within said socket of said housing; and
   mounting tabs extending from said mounting bracket of said cooling fan module for engaging within openings in said housing to secure said cooling fan module within said rectifier module.

9. The rack mounted rectifier module of claim 8, further comprising a rectifier module power circuit connected between said AC input contacts and said rectifier unit, and electrically connected to said mating cooling fan connector, such that at least one of said AC input contacts is disengaged from electrically connecting to said rectifier unit when said cooling fan connector and said mating cooling fan connector are not electrically engaged; and a guide pin mounted to one of said cooling fan module for engaging within a guide hole mounted of said housing when said cooling fan module is engaged within said socket of said housing, and aligning said cooling fan connector for engaging said mating cooling fan connector.

10. The rack mounted rectifier module of claim 9, wherein said socket is disposed in said housing such that said cooling fan module cannot be removed from said housing of said rectifier module until said rectifier module is at least partially removed from said rectifier cabinet, such that said DC output contacts and AC input contacts of said rectifier module are disconnected from mating contacts of the rectifier cabinet.

11. A rack mounted rectifier module for use in a rectifier cabinet having at least partially enclosed spaces for receiving a plurality of said rectifier modules, AC input and DC output, the rectifier module comprising:
    a rectifier unit having DC output contacts, AC input contacts, data signal contacts, and a housing for mounting in said rectifier cabinet in a closely fitting engagement within one of said at least partially enclosed space of said rectifier cabinet, with said DC output contacts, said AC input contacts and said data signal contacts electrically connected to said rectifier cabinet;
    a housing latch having a latch bar for movably fitting within a latch opening formed into a partition member which is disposed adjacent to said one of at least partially enclosed spaces, said latch fitting no further into said partition member than an opposite side of said partition member;
    a cooling fan module having a mounting bracket, a cooling fan unit secured to said mounting bracket and a cooling fan power connector mounted to said bracket, electrically connected to said cooling fan for electrically connecting said cooling fan unit to said rectifier module;
    said housing having a socket receiving said cooling fan module, and a mating cooling fan power connector for engaging said cooling fan power connector to electrically connect said cooling fan unit to electric power when said cooling fan module is inserted within said socket;
    cooling fan module fasteners which extend between said cooling fan module and said housing of said rectifier module for securing said cooling fan module within said housing of said rectifier module;
    wherein said socket for receiving said cooling fan module is open on a side of said housing which is exterior of said rectifier module, and located for removing and receiving said cooling fan module after said housing has been at least partially removed from within the rectifier cabinet; and
    wherein said cooling fan module fits flush with said side of said housing which is exterior of said rectifier module, when said cooling fan module is fully engaged with said housing.

12. The rack mounted rectifier of claim 11, wherein said socket is disposed in said housing, such that said cooling fan module cannot be removed from said housing of said rectifier module until said rectifier module is at least partially removed from said one of said at least partially enclosed spaces, such that said DC output contacts and AC input contacts of said rectifier module are disconnected from mating contacts of the rectifier cabinet.

13. The rack mounted rectifier module of claim 11, further comprising a rectifier module power circuit connected between said AC input contacts and said rectifier unit, and electrically connected to said mating cooling fan connector, such that at least one of said AC input contacts are disengaged from electrically connecting to said rectifier unit when said cooling fan connector and said mating cooling fan connector are not electrically engaged.

14. The rack mounted rectifier module of claim 11, further comprising a guide pin mounted to one of said cooling fan module and said housing for engaging within a guide hole mounted to the other of said cooling fan module and said housing when said cooling fan module is engaged within said socket of said housing, and aligning one of said cooling fan connector and said mating cooling fan connector for engaging the other of said cooling fan connector and said mating cooling fan connector.

15. The rack mounted rectifier module of claim 11, further comprising:
   mounting tabs extending from one of said mounting bracket of said cooling fan module and said housing for engaging within openings in the other of said mounting bracket and said housing to secure said cooling fan module within said rectifier module; and
   captive fasteners mounted to at least part of said mounting tabs for fastening said cooling fan module within said socket of housing of said rectifier module.

16. A method for rack replacing a cooling fan unit of a rectifier module used in a rectifier cabinet having AC input and DC output, comprising the steps of:
   providing a socket in a housing of the rectifier module, a mounting bracket with the cooling fan unit secured thereto, and a pair of mating connectors, one of the pair secured to the mounting bracket and the other of the pair secured to the housing of the rectifier module for receiving the one of the pair and electrically connecting the cooling fan unit to the housing;
   removing the rectifier module at least partially from a forward end of the rectifier cabinet, such that the AC input and the DC output of the rectifier cabinet are electrically disconnected and spaced apart from the rectifier module;
   removing fasteners from securing the cooling fan module from the rectifier housing;
   removing the cooling fan module from within the rectifier housing, which automatically disconnects the pair of mating connectors from electrically connecting the fan unit to the rectifier module and exposes a socket of the housing which is open only one exterior side of the rectifier housing;
   inserting a replacement cooling fan module within the socket of the housing, wherein a guide pin of one of the housing and the mounting bracket fits within a guide bole mounted to the other of the housing and the mounting bracket to automatically align the pari of mating connectors for mutual engagement when the cooling fan module is fully inserted within the socket of the housing;
   fully installing the rectifier module into the rectifier cabinet, such that the AC input and the DC output of the rectifier cabinet are engaged with and electrically connected to the rectifier module; and
   wherein the step of fully installing the rectifier module into the rectifier cabinet places an exterior portion of the cooling fan module adjacent to an adjoining portion of the rectifier cabinet, such that the cooling fan module cannot be removed from being engaged within the rectifier module.

17. The method of claim 16, wherein the steps of removing the rectifier module and installing the rectifier module are in directions which are perpendicular to the steps of removing the cooling fan module and inserting the replacement cooling fan module.

18. The method of claim 16, wherein the step of inserting the replacement cooling fan module fits the exterior portion of the cooling fan module flush with the side of the housing which is exterior of the rectifier module, when the cooling fan module is fully inserted into the housing.

19. The method of claim 16, wherein the step of removing the cooling fan module from the rectifier module and disconnecting the pair of mating contacts disconnects at least one of the AC input and the DC output from the rectifier module.

20. The method of claim 16, wherein:
   the steps of removing the rectifier module and installing the rectifier module are in directions which are perpendicular to the steps of removing the cooling fan module and inserting the replacement cooling fan module;
   the step of inserting the replacement cooling fan module fits the exterior portion of the cooling fan module flush with the side of the housing which is exterior of the rectifier module, when the cooling fan module is fully inserted into the housing; and
   the step of removing the cooling fan module from the rectifier module and disconnecting the pair of mating contacts disconnects at least one of the AC input and the DC output from the rectifier module.

* * * * *